United States Patent [19]

Bartusiak et al.

[11] Patent Number: 5,790,413
[45] Date of Patent: Aug. 4, 1998

[54] PLANT PARAMETER DETECTION BY MONITORING OF POWER SPECTRAL DENSITIES

[75] Inventors: Raymond Donald Bartusiak, Houston, Tex.; Douglas Hugh Nicholson, Fife, Scotland

[73] Assignee: Exxon Chemical Patents Inc., Wilmington, Del.

[21] Appl. No.: 353,474

[22] Filed: Dec. 9, 1994

Related U.S. Application Data

[63] Continuation-in-part of Ser. No. 34,058, Mar. 22, 1993, abandoned.

[51] Int. Cl.⁶ .......................... G06F 17/10; G06F 17/14
[52] U.S. Cl. ............... 364/485; 364/551.01; 364/474.16
[58] Field of Search ..................... 364/485, 551.01, 364/551.02, 474.16, 474.17, 474.19, 582, 574; 340/679, 680; 73/659

[56] References Cited

U.S. PATENT DOCUMENTS

| | | | |
|---|---|---|---|
| 3,694,637 | 9/1972 | Edwin et al. | 235/151.3 |
| 3,705,516 | 12/1972 | Reis | 73/71.4 |
| 3,883,726 | 5/1975 | Schmidt | 235/152 |
| 4,060,716 | 11/1977 | Pekrul et al. | 364/576 |
| 4,303,979 | 12/1981 | Kato et al. | 364/485 |
| 4,413,519 | 11/1983 | Bannister et al. | 73/660 |
| 4,744,041 | 5/1988 | Strunk et al. | 364/565 |
| 4,817,176 | 3/1989 | Marshall et al. | 382/43 |
| 4,824,016 | 4/1989 | Cody et al. | 239/8 |
| 4,965,513 | 10/1990 | Haynes et al. | 324/158 |
| 4,965,757 | 10/1990 | Grassart | 364/576 |
| 4,975,633 | 12/1990 | Toda et al. | 324/77 B |
| 4,980,844 | 12/1990 | Demianenko et al. | 364/550 |
| 5,032,826 | 7/1991 | Miller et al. | 340/647 |
| 5,087,873 | 2/1992 | Murphy et al. | 324/71.2 |
| 5,201,292 | 4/1993 | Grajski et al. | 123/425 |
| 5,305,235 | 4/1994 | Izui et al. | 364/551.01 |
| 5,352,891 | 10/1994 | Monnig et al. | 364/498 X |

FOREIGN PATENT DOCUMENTS

| | | |
|---|---|---|
| 56-090220 | 7/1981 | Japan. |
| 62-245931 | 10/1987 | Japan. |

OTHER PUBLICATIONS

International Search Report for Counterpart PCT Application No,. PCT/US94/03067.

Primary Examiner—Emanuel T. Voeltz
Assistant Examiner—M. Kemper
Attorney, Agent, or Firm—Linda K. Russell

[57] ABSTRACT

A method for determining whether a current state of a process variable output signal is within acceptable limits includes the following steps: establishing reference data by sampling a plant's process variable output signal when the plant is operating at steady state and analyzing the sampled output signal to derive normalized reference data including an energy content of each of a plurality of frequency components of the sampled output signal. The procedure establishes a current operational data base by sampling a process variable signal when the plant is in operation. The sampled current output signal is analyzed to derive current data including a normalized energy content of each of a plurality of its frequency components. For each common frequency component of the reference data and the current data, the procedure compares their normalized energy contents and issues a non-steady state signal if the comparison indicates that the compared energy contents exceed a predetermined limit.

6 Claims, 9 Drawing Sheets

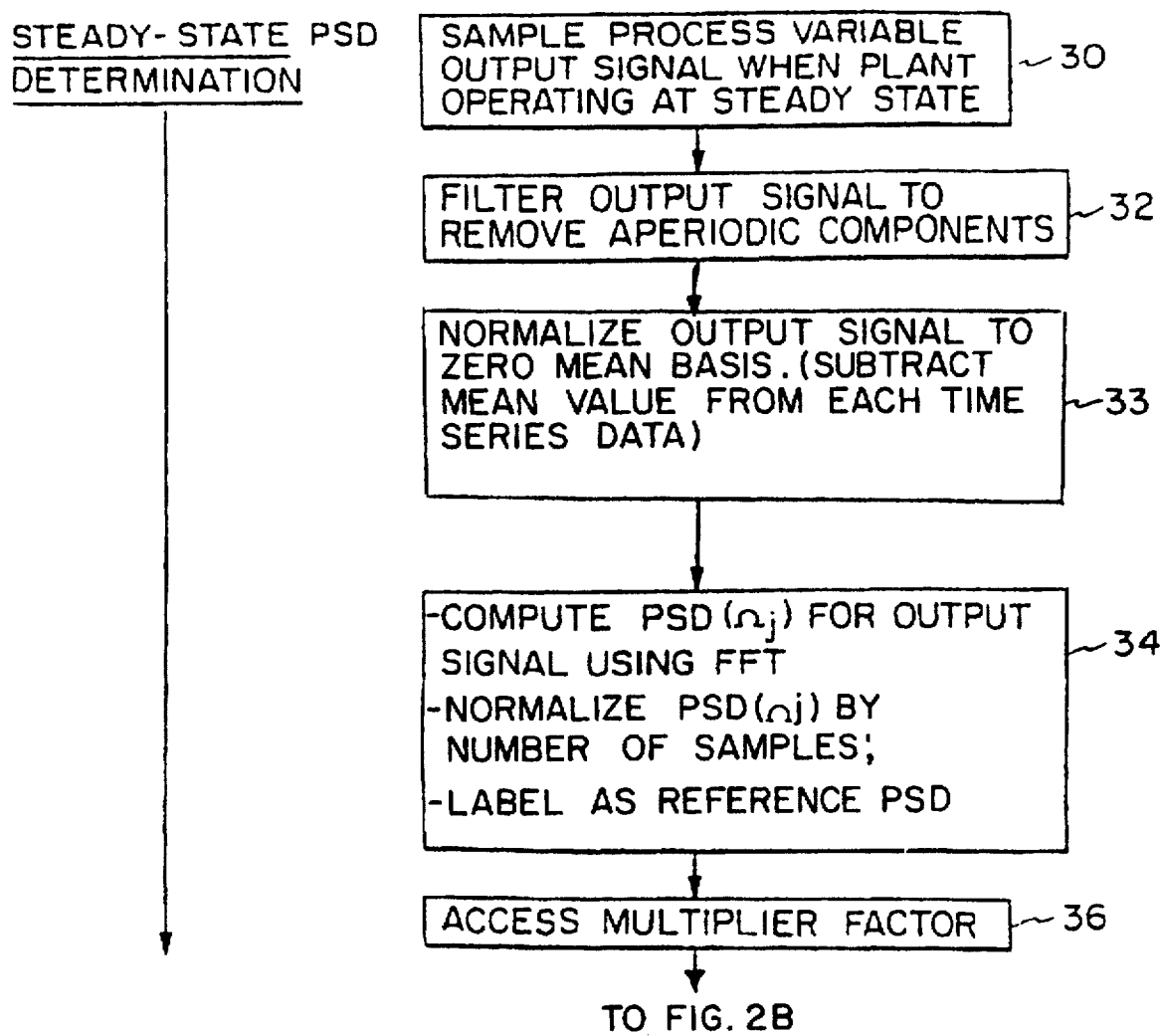

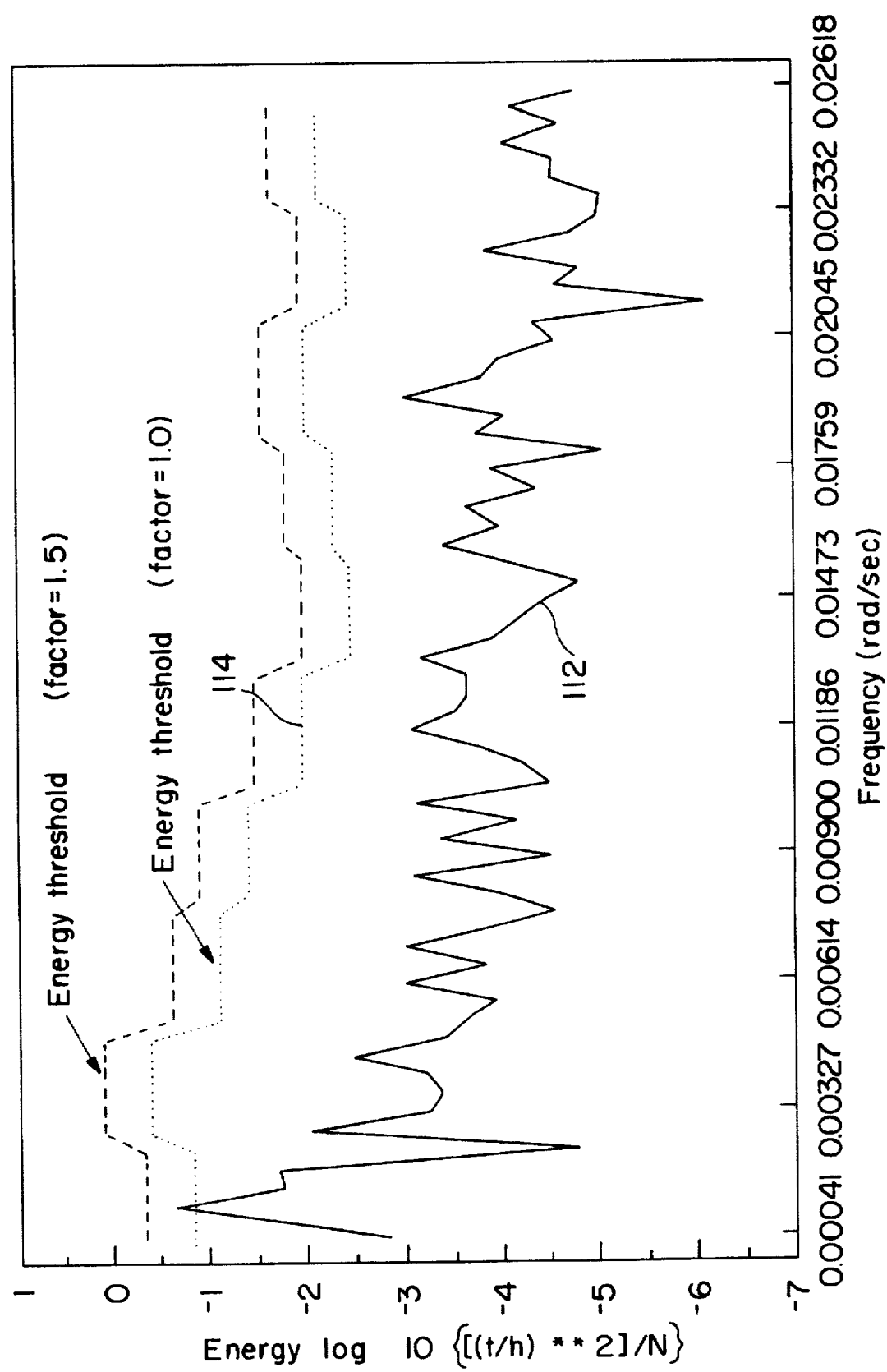

PLANT PARAMETER DETECTION BY MONITORING OF POWER SPECTRAL DENSITIES

This patent application is a Continuation-In-Part of U.S. patent application, Ser. No. 08/034,058, filed Mar. 22, 1993 now abandoned.

FIELD OF THE INVENTION

This invention relates to process control systems, and more particularly, to a system for determining whether a process parameter is in a steady or unsteady state through a use of the parameter's power spectral density.

BACKGROUND OF THE INVENTION

In controlling dynamic plant processes, it is often necessary to know whether process variables are in a steady state or in an unsteady state. While, many process control systems monitor plant variables and compare them against predetermined set points, it is often more important to know whether deviations of a plant variable, over time, away from a setpoint are significantly different from normal. It is also important to be able to predict whether a plant parameter output exhibits an incipient condition which may lead to an unsteady state.

The prior art contains many teachings concerning plant parameter monitoring for process control applications. In U.S. Pat. No. 4,744,041 to Strunk et al., the steady state speed of a dc motor is detected through the use of fast Fourier transform analysis. Strunk et al employ a current sensor which measures the current in a test motor and sends the sampled current signal as data to a computer. The computer then samples and stores measured instantaneous current values at plurality of discrete times and performs a fast Fourier transform on the steady state current to determine its power spectral density. Based on the computed power spectral density, the speed of the motor is determined by detecting the frequency at which maximum power is used.

Kato et al., in U.S. Pat. No. 4,303,979, disclose a system for monitoring frequency spectrum variations in output signals. The system initially determines an RMS average frequency value for an input signal. In addition, it determines RMS values for each of a plurality of frequency subranges within the input signal. The system then monitors an input test signal and obtains its RMS value and the average frequency of the overall input signal. If the determined reference and test frequencies differ substantially in their RMS and average frequency values, the RMS value and average frequency of an anomalous frequency component peak is calculated. The average of the anomalous frequency component is then compared to boundary frequency values to determine in which frequency range the anomalous value lies. The RMS value of the thus determined frequency range and the average frequency are then employed to determine correction parameters.

Grassart, in U.S. Pat. No. 4,965,757 discloses a process and device for decoding a received, encoded signal. The received signal is first filtered, sampled and digitized before being stored. Digitized samples of each successive signal block are transposed to the frequency domain by a fast Fourier transform. The thus computed spectra are compared with stored theoretical values for each possible code signal in order to identify the received encoded signal.

Schmidt, in U.S. Pat. No. 3,883,726, discloses a fast Fourier transform algorithm computer that utilizes an attenuated input data window. An input buffer receives input time samples, a cosine square attenuator superimposes a cosine squared shape on the input data samples, and then the resultant signal is passed to the fast Fourier analysis computer. A delay device, adders and an output buffer are provided for removing the effect of the attenuating input data window.

Toda et al, in U.S. Pat. No. 4,975,633, disclose a spectrum analyzer that displays spectrum data and power values of an RF or optical signal. An input signal is directed down one path where it is subjected to a spectrum analysis, and down a second path where its power value is determined. Display means indicates both the spectrum data and the power value.

Murphy et al., in U.S. Pat. No. 5,087,873, disclose apparatus for detecting a corrosion state of buried metallic pipe. In FIGS. 4–7, a spectrum analyzer receives input signals from a pair of magnetometers. The magnetic field, as a function of frequency, is determined by conducting a fast Fourier transform on the received signals, with the resulting spectrum indicating the amplitude and phase of the magnetic field. Those values are used to determine the condition of the buried pipe.

Demjanenko et al. in U.S. Pat. No. 4,980,844 teach a method for diagnosing mechanical conditions of a machine. The Demjanenko et al. procedure is computationally complex and involves the creation of one or more sets of reference signatures (those reference signatures may be power spectrum data). Similar test data is then acquired and a comparison action occurs. The procedure averages the test and reference signatures, determines a distance therebetween (i.e. the Euclidean distance), compares that calculated distance against a computed threshold value, and classifies the distance as being normal or abnormal based upon the comparison. The threshold is established as a function of the mean reference distance and reference and test standard deviations.

Toshiba Japanese patent application S62-245931 describes a procedure for determining abnormalities in a rotating pump. A plurality of reference frequency spectra are stored in memory (called restriction patterns), each reference frequency spectrum indicative of an operational state of the pump under different load conditions. To conserve memory, a "bias" procedure is employed to modify a closest reference frequency spectrum to bring it into the load (i.e. power) range of a test frequency spectrum taken from the pump. If the test frequency spectrum exceeds limits determined from the "biased" reference frequency spectrum, an alarm is given. The Toshiba system thus requires storage of a plurality of reference frequency spectra and accurate modification of a chosen spectrum by application of a bias value thereto to enable its comparison with a test spectrum. Misadjustment of the bias can negate the effectiveness of the test system.

Accordingly, it is an object of this invention to provide a method for determining when a process variable output signal is in a steady state condition.

It is another object of this invention to provide a method for analysis of a parameter output signal to indicate an incipient unsteady state.

It is still another of this invention to provide a plant parameter output signal detection technique that is dependent upon power spectral densities.

SUMMARY OF THE INVENTION

A method for determining whether a current state of a process variable output signal is within acceptable limits includes the following steps: establishing reference data by sampling a plant's process variable output signal when the plant is operating at steady state and analyzing the sampled output signal to derive normalized reference data including an energy content of each of a plurality of frequency components of the sampled output signal. The procedure establishes a current operational data base by sampling a process variable signal when the plant is in operation. The sampled current output signal is analyzed to derive current data including a normalized energy content of each of a plurality of its frequency components. For each common frequency component of the reference data and the current data, the procedure compares their normalized energy contents and issues a non-steady state signal if the comparison indicates that the compared energy contents exceed a predetermined limit.

DESCRIPTION OF THE DRAWINGS

FIGS. 2a and 2b are high level flow diagrams illustrating the method of the invention;

FIG. 8 is a semi-log plot of energy vs. frequency of the plot of FIG. 7 indicating, at one energy threshold, that a disturbance exceeds the threshold.

DETAILED DESCRIPTION OF THE INVENTION

The system and method for carrying out the invention determine whether a plant process is operating within a steady state or a non steady state condition. In brief, the system determines a reference power spectral density (PSD) of a process variable, during a time that the process variable is in a steady state. A power spectral density is a representation of an energy content of a signal as a function of its component frequencies and is computed via a fast Fourier transform (FFT) which converts a time-domain signal into its frequency-domain representation.

The signal from which the reference PSD is derived is subjected to a first normalization procedure to derive a zero mean basis for the signal. This normalization is accomplished by subtracting the mean process variable value of a time series of sample data values from each time series sample data value. A second normalization procedure is performed on the spectral data by dividing each power value in the spectrum by the number of time series signal samples used compute the spectrum. The first normalization procedure enables a single stored reference PSD to be used as a reference in all subsequent test procedures and eliminates the need for plural reference spectra or for a biasing procedure to adjust the reference spectra. The second normalization procedure enables the reference PSD to be compared to a current PSD, even in the event that the time windows differ during which the current and reference PSD's are derived.

The reference PSD is compared with a current PSD derived when the process variable is in operation. The current PSD is also subjected to the first and second normalization procedures described above with respect to the reference PSD. If the current PSD is too energetic (either with respect to slow changes like ramps or with respect to fast changes like spikes) relative to the reference PSD, the process variable is determined to be unsteady and such condition is signaled.

Figure 1:
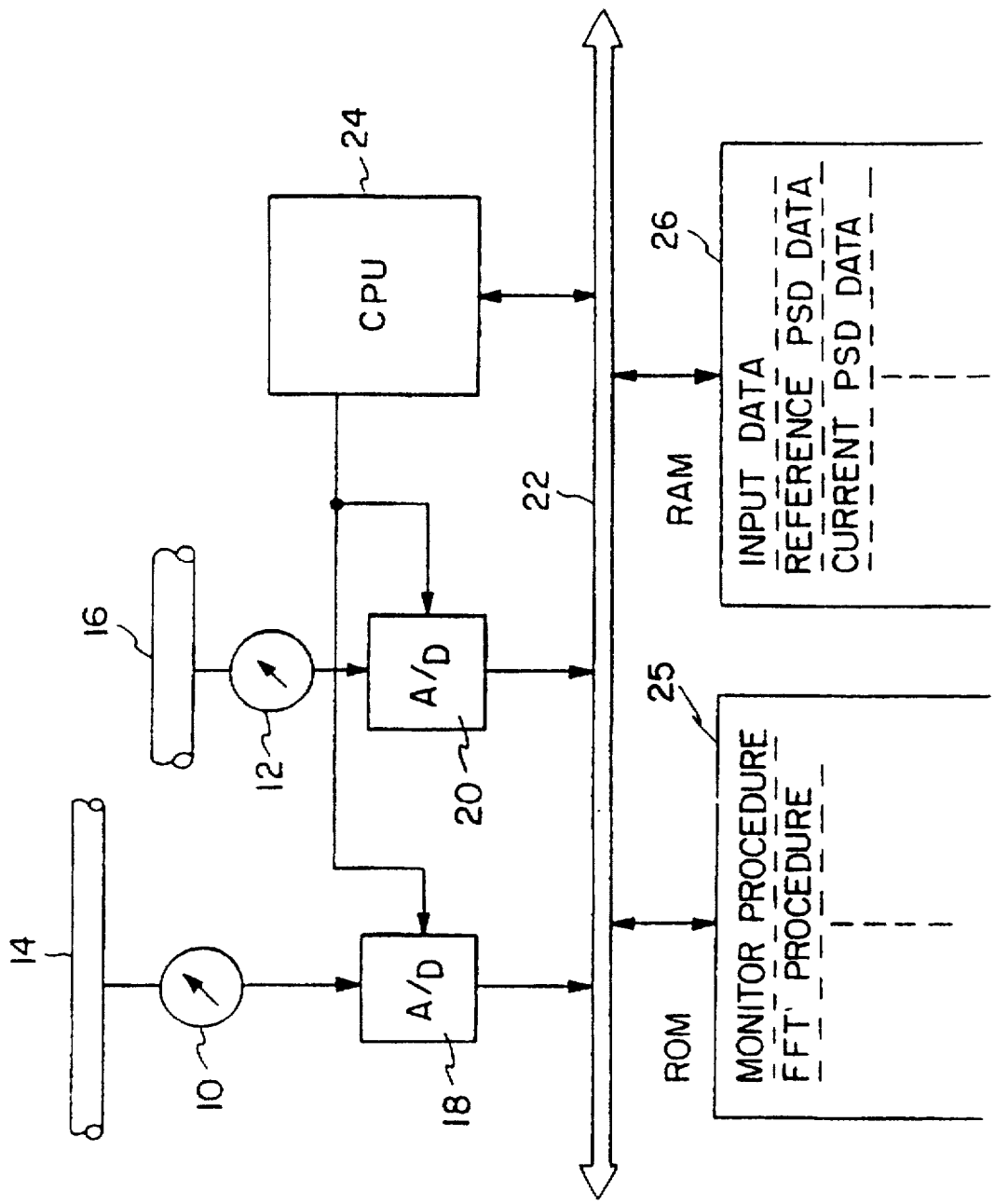
FIG. 1 is a block diagram of a system for performing the method of the invention.

Turning to FIG. 1, flow monitors 10 and 12 continuously monitor the state of flow in a pair of pipes 14 and 16, respectively. Pipes 14 and 16 form portions of a plant whose process variables are continuously monitored to determine if any one has moved from a steady state to a unsteady state. Those skilled in the art will realize that the representation of inputs from pipes 14 and 16 is merely exemplary and that a plurality of other types of system variables (e.g. pressure, volume, temperature, etc.) can be monitored. The outputs from each of flow monitors 10 and 12 are fed to respectively connected analog to digital converters (A/D) 18, 20 whose outputs are, in turn, connected to a bus 22 that forms the main communication pathway in a control data processing system.

A central processing unit (CPU) 24 is interconnected with bus 22 and also is connected to A/D converters 18 and 20 to enable timed, sample signals to be derived therefrom. A read only memory (ROM) 25 is connected to bus 22 and contains a procedure for operating CPU 24 to monitor sensors 10, 12 and a procedure for enabling CPU 24 to perform a fast Fourier transform (FFT) of input data received from A/D converters 18 and 20. A random access memory (RAM) 26 is connected to bus 22 and contains allocated memory for storing: raw input data from A/D converters 18 and 20; reference PSD data determined during a time that a process variable being monitored is in a steady state; and current PSD data that is determined when the process variable is being currently monitored.

Figure 2B:
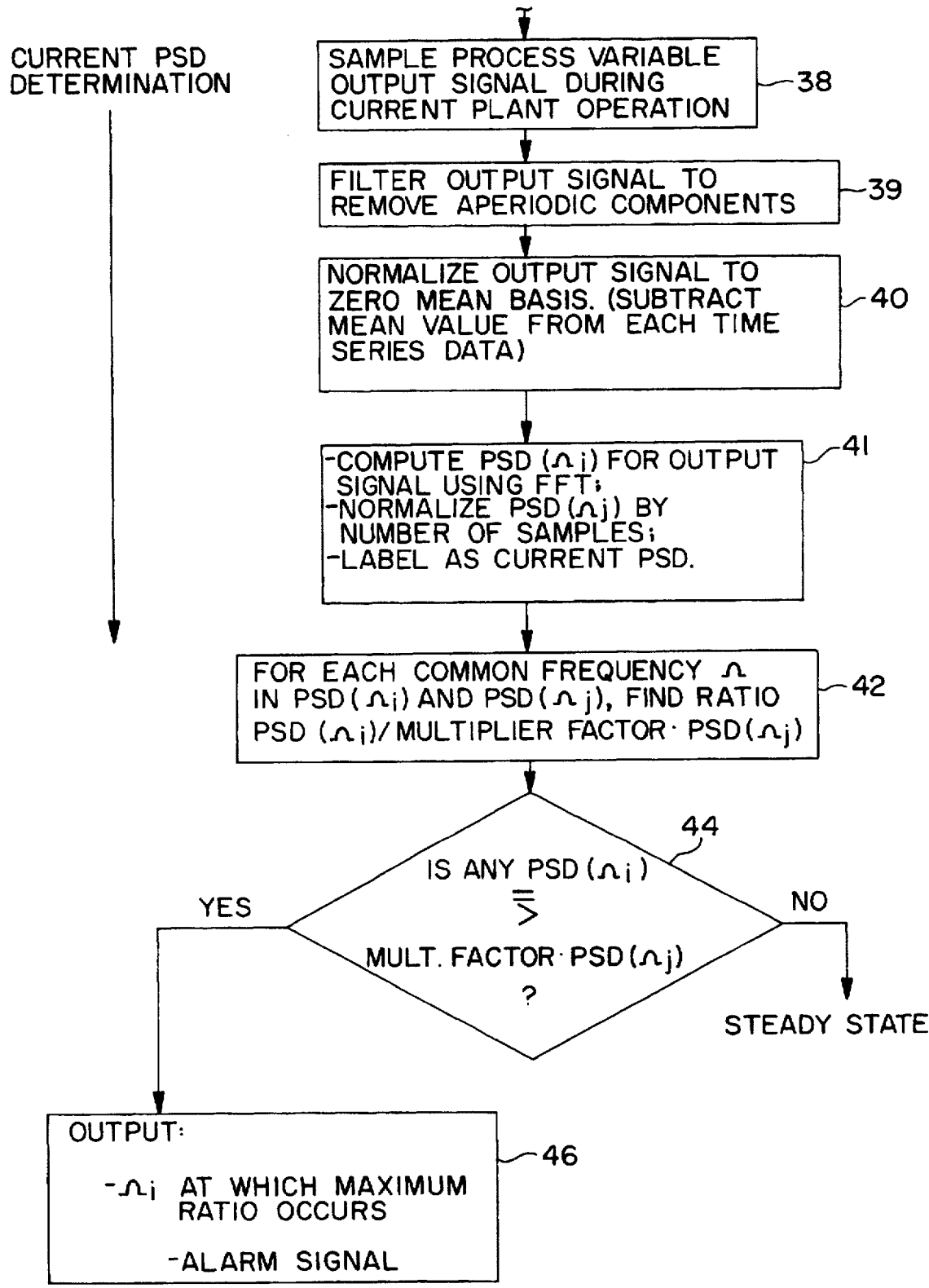

The operation of the system of FIG. 1 will now be described in conjunction with the flow diagram shown in FIGS. 2a and 2b. Initially, a steady state (i.e. reference) PSD is determined for a monitored process variable. The steady state PSD is derived by initially time sampling a process variable output signal when the plant is operating in a steady state condition (box 30). To avoid contamination of the steady state PSD, the time sampled output signal is filtered to remove aperiodic signals therefrom (box 32). The filtered output samples are then normalized to a zero mean basis by subtracting the mean process variable value of a time series of sample data values from each time series sample data value. This eliminates any bias that is operating-state dependent (box 33).

The filtered, normalized periodic sample signals are then subjected to an FFT analysis by central processor 24, under control of a procedure read out from ROM 24 (box 34). A second normalization procedure eliminates any bias that results from the time window during which the time series samples were detected. The second normalization procedure divides each spectral frequency data value by the number of time samples so as to achieve a "time" normalization of the frequency data.

The result of the PSD analysis is a series of normalized energy values at frequencies ($\omega_j$) for the filtered steady state signal, each normalized energy value at a frequency ($\omega_j$) having an attribute associated therewith that is proportional to the energy contained in the particular frequency signal. Those frequencies and energy value attributes are stored in RAM 26 as steady state (or reference) PSD data.

At this point, a user-supplied multiplier factor is accessed that is to be applied to each energy value attribute of the steady state PSD. The multiplier factor enables the derivation of an energy threshold which is the amount that a process variable's current PSD must exceed a reference PSD to be considered in an unsteady state (box 36).

The system of FIG. 1 now switches to a "current" monitor state wherein it monitors the outputs of sensors 10, 12, etc. During the time that any one sensor is monitored, its output is converted by an FFT procedure to a PSD representation which is then compared with the previously derived steady state PSD for the same sensor (i.e. is stored in RAM 26). CPU 24 commences the current monitor state by sampling output signals from a sensor (e.g. 10) during operation of the plant (Box 38). After sufficient samples have been accumulated, CPU 24 filters the sampled current output signal to remove aperiodic components (box 39), normalizes the filtered output signal to a zero-mean basis (identically as with the reference PSD) (box 40) and then computes a PSD($\omega_i$) for the sampled current output signal using an FFT procedure (box 41). Each spectral frequency data value is now divided by the number of time series samples to achieve a "time" normalization of the frequency data. Time normalizing of both reference and current PSD data enables those data to be compared even if different time windows are used during their detection.

It is now determined whether any current PSD ($\omega_i$) is greater than its corresponding steady state PSD ($\omega_j$), multiplied by the user-inputted multiplier factor (boxes 42,44). If yes, the system outputs the value of $\omega_i$ of at which the maximum energy ratio is found and a signal is issued that the process variable is in a non steady state condition (box 46).

If the decision indicated in decision box 44 is that no current PSD($\omega_i$) exceeds the multiplier factor times the steady state PSD($\omega_j$), then it is determined that the sampled current output signal is in a steady state condition and no further action is required. At this point, the procedure terminates and CPU 24 may then monitor another current process variable signal and the procedure is repeated.

Figure 3:
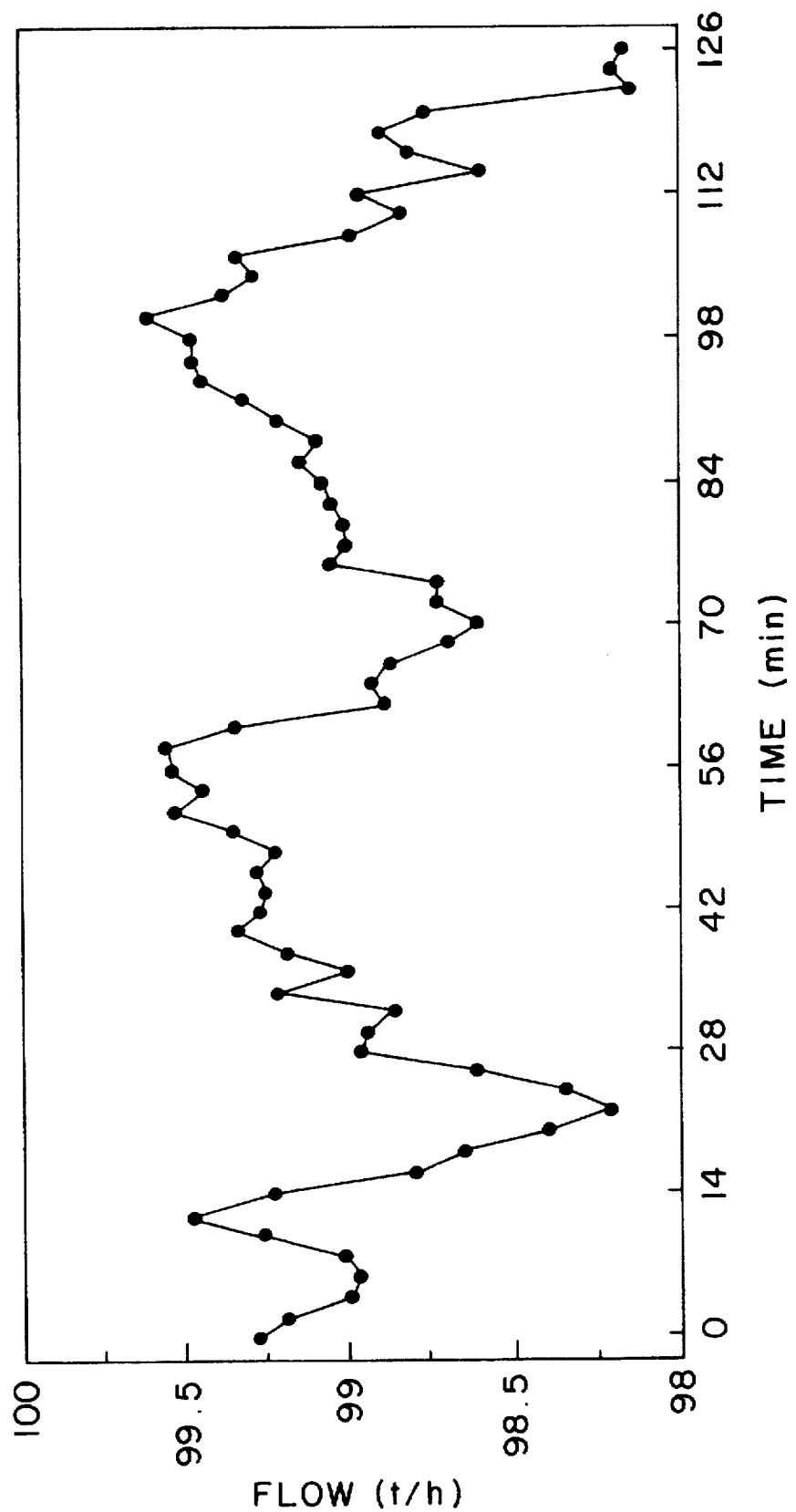
FIG. 3 is a plot of a variation in flow over time in an exemplary plant.
Figure 4:
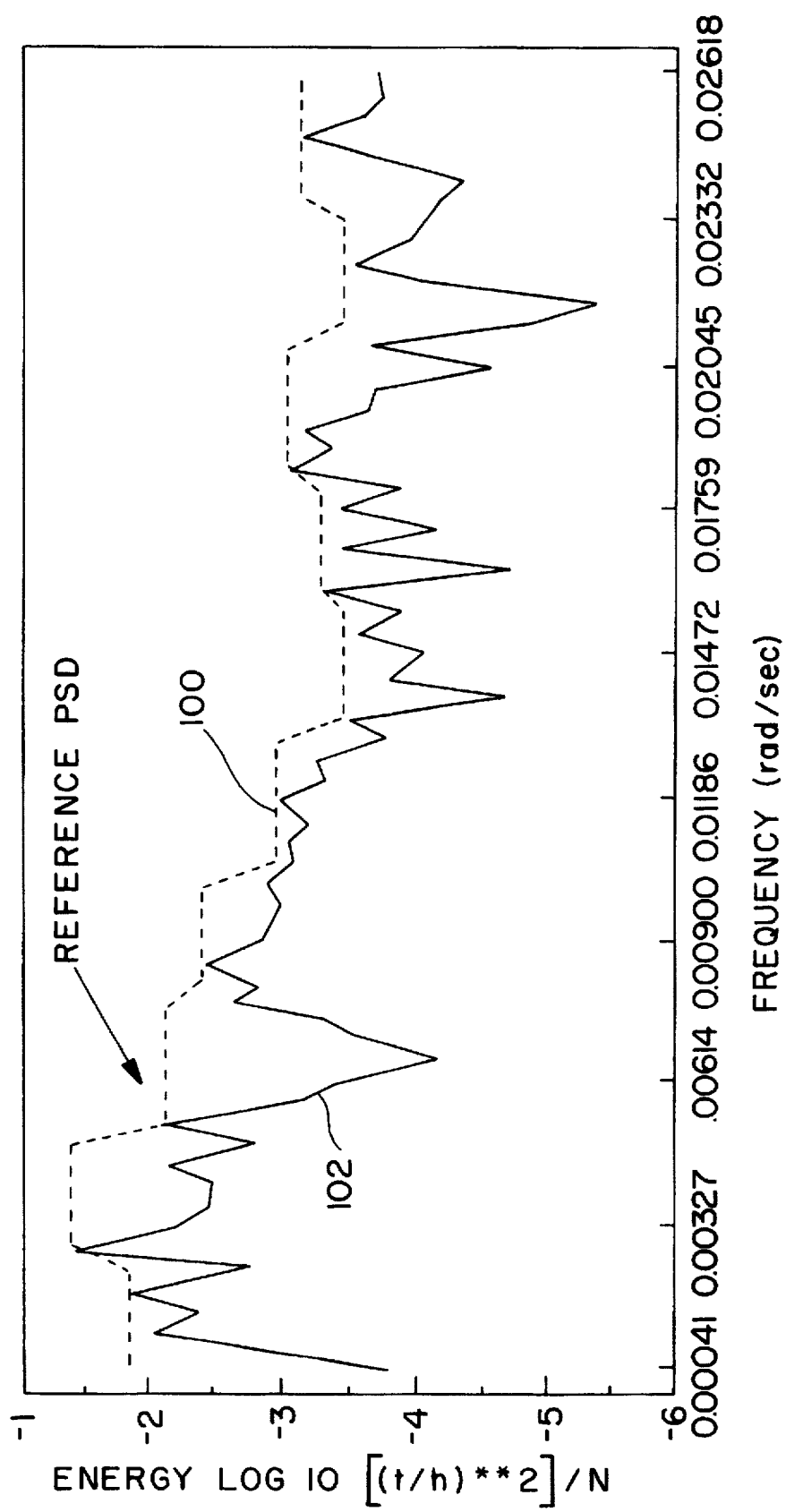
FIG. 4 is a semi-log plot of energy versus frequency derived from the signal shown in FIG. 3.

FIGS. 3–8 contain examples of the procedure described above. In FIG. 3, a process variable (flow) is plotted over a period of several hours (126 minutes). Each dot on the plot trace evidences a sampled flow value that is input to the system. Prior to monitoring the current flow values, a reference flow during steady state of the same process variable was monitored and a reference PSD was derived (e.g. dotted trace 100 in FIG. 4). Reference PSD trace 100 has been quantized into ten "bins" so as to enable averaged comparisons to be made. The PSD for the signal of FIG. 3 is then calculated (trace 102) and is seen to exhibit considerable variations in power over the frequency spectrum.

Figure 5:
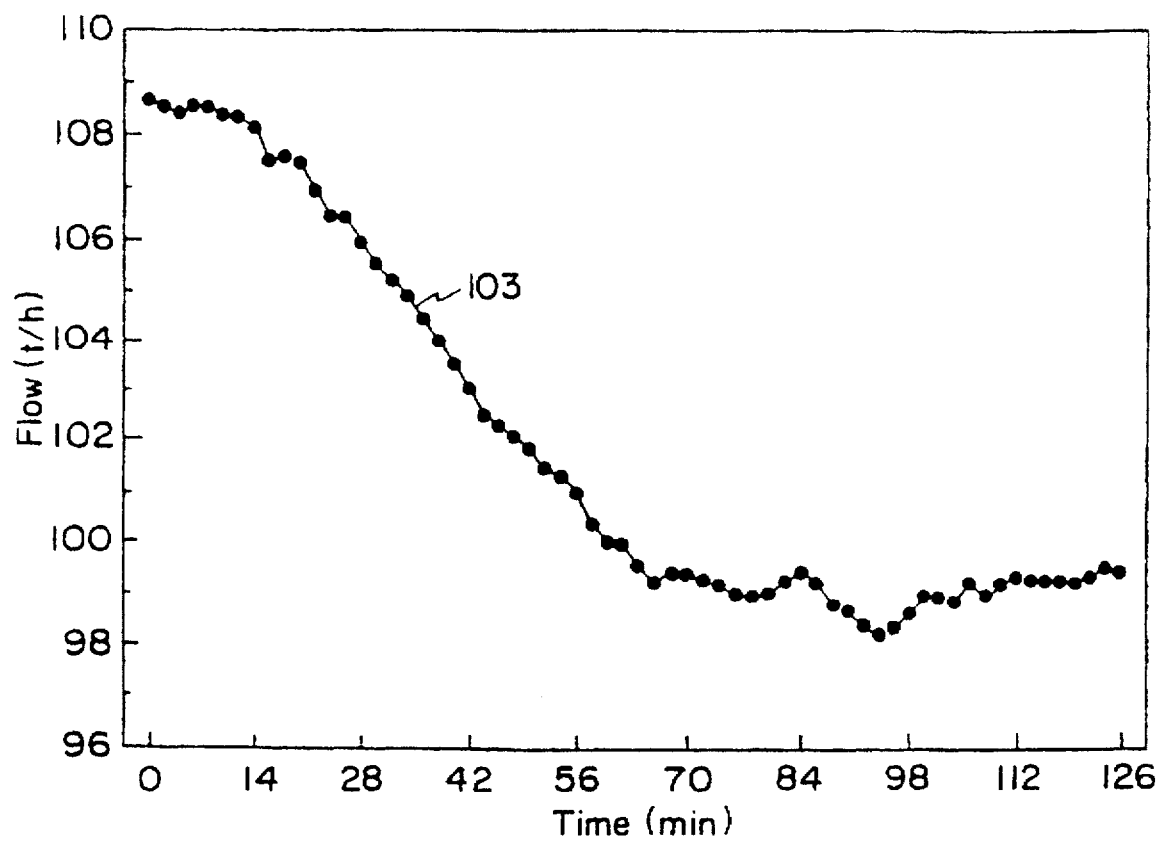
FIG. 5 is a plot of flow vs. time showing a negative-going ramp disturbance.
Figure 6:
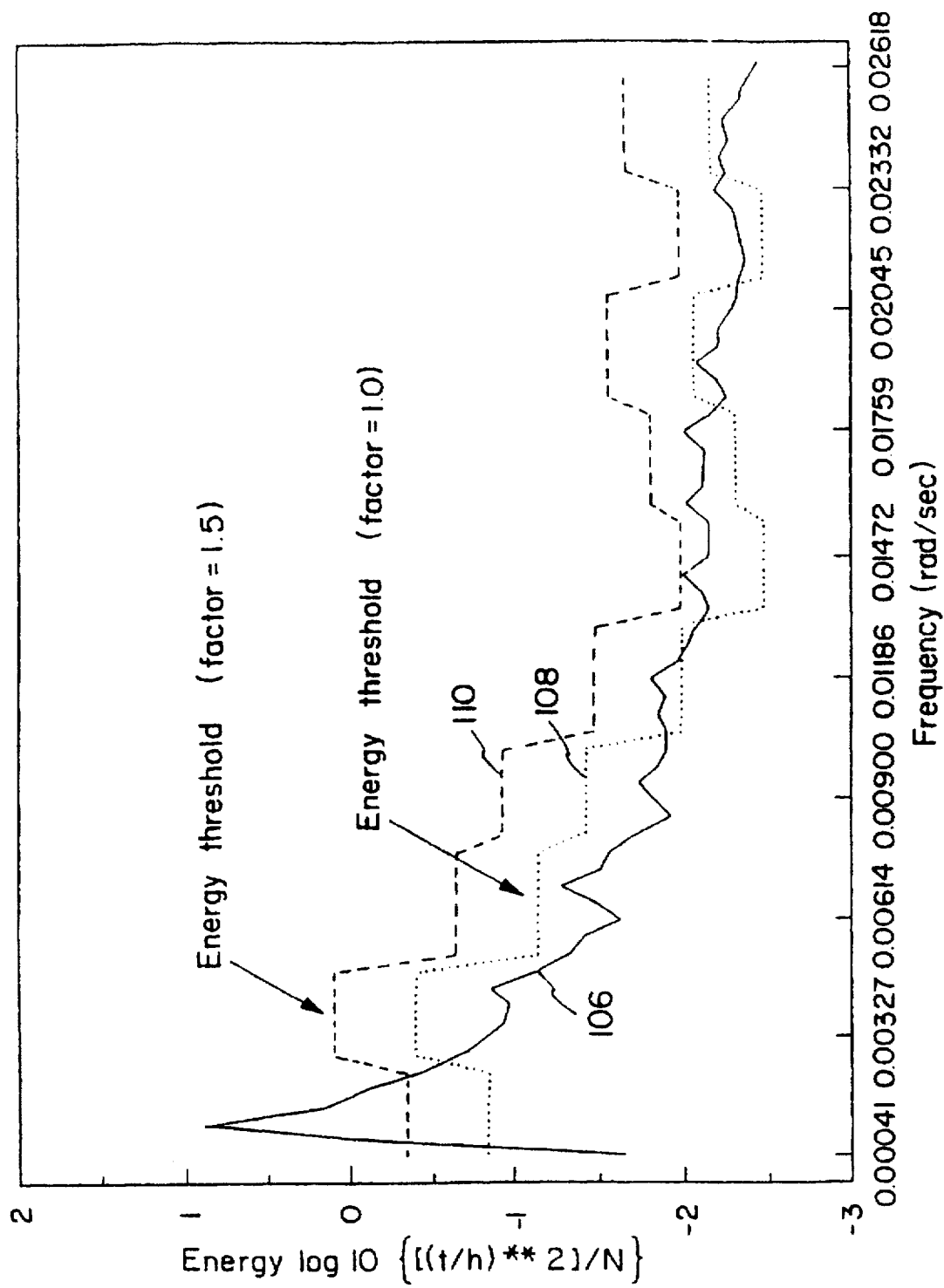
FIG. 6 is a semi-log plot of energy vs. frequency of the plot of FIG. 5 indicating the that the ramp disturbance produces the most severe violation of plotted energy thresholds in the low frequency range.

Turning to FIG. 5, a ramp disturbance 103 is plotted (flow vs. time). Furthermore, for exemplary purposes only, it is assumed that two multiplier factors (e.g. 1.0 and 1.5) have been utilized to derive energy PSD thresholds 108, 110 respectively. The conversion of ramp signal 103 to a PSD results in energy versus frequency trace 106 shown in FIG. 6. Note that the ramp disturbance 103 produces the most severe violation of both PSD energy thresholds 108 and 110 in the low frequency range. Under such conditions, an alarm is generated. The system may be adjusted such that an alarm is inhibited from issuance if only energy threshold 108 is exceeded, however the frequencies at which the energy exceeds threshold 108 may be output for user monitoring of a possibly incipient instability mode.

Figure 7:
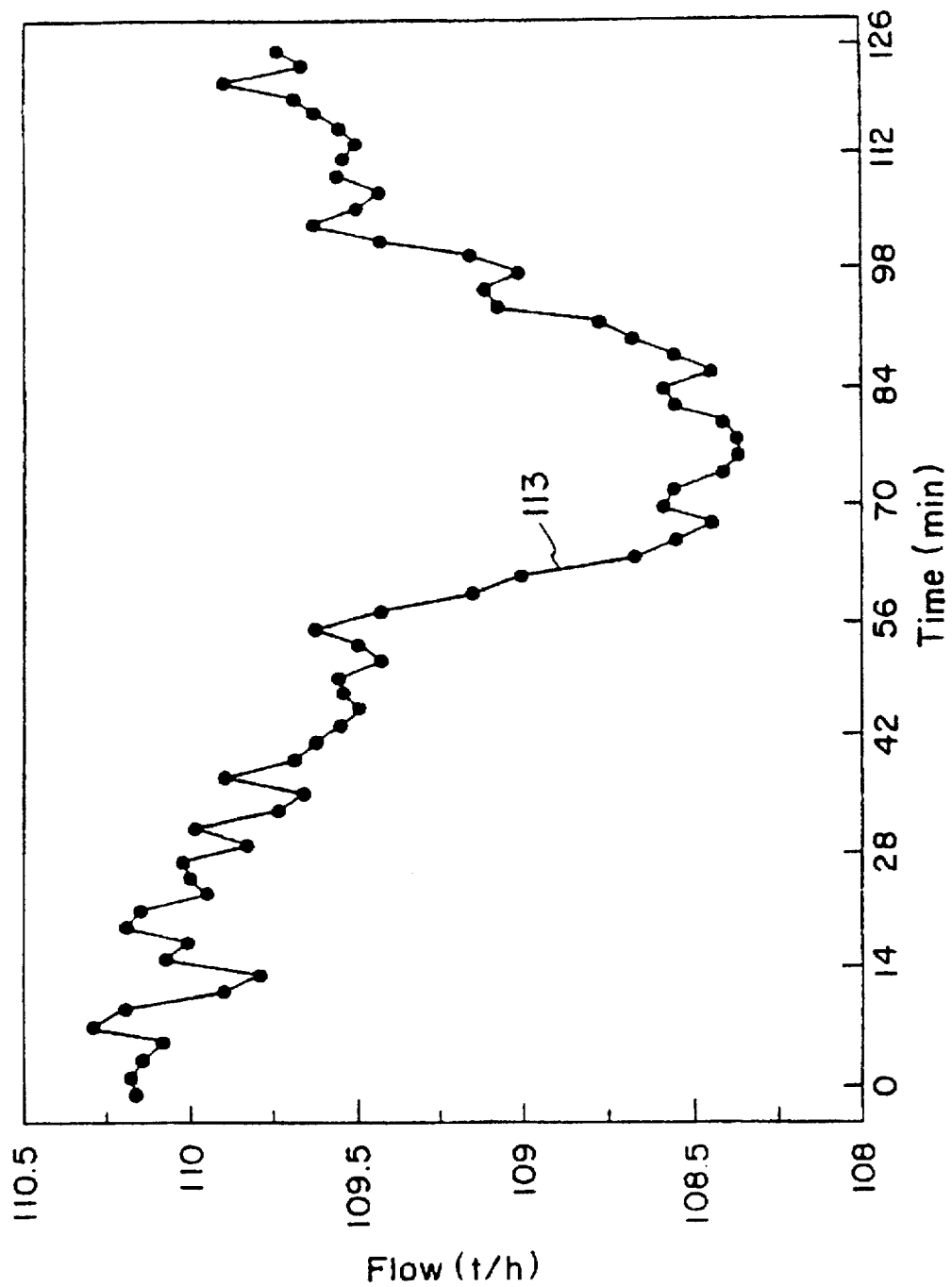
FIG. 7 is a plot of flow vs. time showing a "U" type disturbance in the flow signal.

In FIG. 7, a "U" disturbance 113 is depicted in a plot of flow versus time. Over the span of the time during which the flow is monitored in FIG. 7, the flow difference is not large and yet it is clear that a disturbance does occur. As shown by FIG. 8, such disturbance is picked up by comparison of the peak corresponding PSD trace 112 with energy threshold 114.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A method for determining a current state of a process variable output signal and whether the output signal is within acceptable limits, the method comprising the steps of:

(a) establishing reference comparison data for said process variable by sampling a reference output signal over a first period of time when said plant is operating at steady state, each sampled reference output signal further subjected to a first normalization procedure to convert each sampled signal to a zero mean basis;

(b) processing said sampled output signal to derive reference spectral data for said process variable, said reference spectral data manifesting a normalized energy content for each of a plurality of frequency components of said sampled output signal, each reference spectral data value subjected to a second normalization procedure, wherein each spectral data value is divided by a sample time related value, a sample time being a window of time during which an output signal is sampled in preparation for deriving spectral data values therefor;

(c) storing said reference spectral data;

(d) establishing current operational data for said process variable by sampling a current output signal for said process variable over a second period of time when said plant is in operation, each sampled current output signal further subjected to a first normalization procedure to convert each sampled signal to a zero mean basis;

(e) processing said sampled current output signal to derive current spectral data therefrom, said current spectral data manifesting a normalized energy content of each of a plurality of frequency components of said sampled current output signal, each current spectral data value subjected to a second normalization procedure, wherein each spectral data value is divided by a sample time related value, a sample time being a window of time during which an output signal is sampled in preparation for deriving spectral data values therefor; and (f) for each of a plurality of common frequency components of said reference spectral data and current spectral data, comparing normalized energy contents therefor and issuing a signal if said comparing indicates that an energy content threshold of any frequency component of said current spectral data exceeds an energy content of a common frequency component of said reference spectral data.

2. The method as recited in claim 1 wherein said sample time related value is a number of samples of an output signal taken during said window of time.

3. The method as recited in claim 1 wherein step (f) further indicates the common frequency for which said signal is issued.

4. The method as recited in claim 1 wherein said analyzing steps (b) and (e) perform Fourier analyses of said sampled output signals to determine the frequency components and energy content of each thereof.

5. The method as recited in claim 1 wherein said signal is only issued in step (f) if an energy in a frequency component of said current data exceeds an energy content of a common frequency component of said reference data, multiplied by a set factor.

6. The method as recited in claim 1 wherein, in step (f), said signal is issued after a ratio of energies of each of said common frequency components is determined and it is determined that at least one said ratio exceeds a predetermined factor.

* * * * *